(12) United States Patent
Hsu et al.

(10) Patent No.: US 9,793,380 B2
(45) Date of Patent: Oct. 17, 2017

(54) SEMICONDUCTOR STRUCTURE AND FABRICATION METHOD THEREOF

(71) Applicant: UNITED MICROELECTRONICS CORP., Hsin-Chu (TW)

(72) Inventors: Chih-Kai Hsu, Tainan (TW); Yu-Hsiang Hung, Tainan (TW); Ssu-I Fu, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/794,821

(22) Filed: Jul. 9, 2015

(65) Prior Publication Data
US 2016/0379839 A1 Dec. 29, 2016

(30) Foreign Application Priority Data
Jun. 23, 2015 (TW) .............................. 104120067 A

(51) Int. Cl.
*H01L 21/3105* (2006.01)
*H01L 29/06* (2006.01)
*H01L 29/66* (2006.01)
*H01L 29/78* (2006.01)

(52) U.S. Cl.
CPC .. *H01L 29/66795* (2013.01); *H01L 29/66545* (2013.01); *H01L 29/785* (2013.01)

(58) Field of Classification Search
CPC ........... H01L 29/4966; H01L 29/66545; H01L 21/823842
USPC .......................... 257/288, 369, 401; 438/586
See application file for complete search history.

(56) References Cited

U.S. PATENT DOCUMENTS 8,765,546 B1 * 7/2014 Hung .............. H01L 21/823431
257/190
2013/0270644 A1 10/2013 Anderson
2014/0306297 A1 * 10/2014 Ching ............... H01L 29/66795
257/401

* cited by examiner

*Primary Examiner* — Jonathan Han
(74) *Attorney, Agent, or Firm* — Winston Hsu

(57) ABSTRACT

A method for making a semiconductor device. A substrate having a fin structure is provided. A continuous dummy gate line is formed on the substrate. The dummy gate line strides across the fin structure. A source/drain structure is formed on the fin structure on both sides of the dummy gate line. An interlayer dielectric (ILD) is formed on the dummy gate line and around the dummy gate line. The ILD is polished to reveal a top surface of the dummy gate line. After polishing the ILD, the dummy gate line is segmented into separate dummy gates.

10 Claims, 12 Drawing Sheets

SEMICONDUCTOR STRUCTURE AND FABRICATION METHOD THEREOF

CROSS REFERENCE TO RELATED APPLICATION

This application claims the benefit of Taiwan patent application No. 104120067, filed on Jun. 23, 2015, the disclosure of which is incorporated herein in its entirety by reference.

BACKGROUND OF THE INVENTION

1. Field of the Invention

The invention generally related to a semiconductor structure and a method of making the same. More particularly, the invention related to a method of fabricating a high-k metal gate semiconductor device.

2. Description of the Prior Art

As the size of the integrated circuit devices continues to scale down, the polysilicon gate and the silicon dioxide insulating layer of a metal-oxide-semiconductor field effect transistor (MOSFET) structure have been confronted with the physical limits of the material itself. To meet the demands of scalability, it is necessary to incorporate high-k metal gate (HK/MG) process.

Today, two main integration options remain: gate-first (often referred to as MIPS, metal inserted poly-silicon) and gate-last (also called RMG, replacement metal gate). The terminology "first" and "last" refers to whether the metal electrode is deposited before or after the high temperature activation anneal of the flow. The replacement metal gate (RMG) process flow allows the use of aluminum as a conductor material.

In conventional HK/MG process, the dummy poly silicon gate line is segmented (also called poly cut) before the source/drain epitaxial growth process. As a result, the epitaxial extrusion defect is very possible to occur at the distal ends of the dummy poly silicon gate segments, which impacts the process yield. Therefore, there is a need in this technical field to provide an improved semiconductor structure and manufacturing process to overcome the deficiencies described hereinabove.

SUMMARY OF THE INVENTION

This invention provides an improved semiconductor structure and manufacturing method to overcome the deficiencies of the prior art described hereinabove. The dummy gate line is segmented after the source/drain epitaxial growth and the interlayer dielectric (ILD) planarization process.

According to one embodiment of the invention, a method of making a semiconductor device is disclosed. First, a substrate having a fin structure thereon is provided. A continuous dummy gate line is formed on the substrate. The dummy gate line strides across the fin structure. A source/drain structure is formed on the fin structure on either side of the dummy gate line. An interlayer dielectric (ILD) is formed on the dummy gate line and around the dummy gate line. The ILD is polished to thereby reveal a top surface of the dummy gate line. After polishing the ILD, the dummy gate line is segmented into separated dummy gates.

According another embodiment of the invention, a semiconductor device structure includes a substrate, a first gate structure comprising a first distal end, and a second gate structure spaced apart from the first gate structure and aligned with the first gate structure. The second gate structure comprises a second distal end facing the first distal end. A cut slot is disposed between the first distal end and the second distal end. A liner layer is disposed on interior surface of the cut slot. A dielectric layer is disposed on the liner layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1-11 illustrate a process of fabricating a semiconductor device according one embodiment of the invention, wherein:

FIGS. 1-5 are schematic plan views showing partial layout of the semiconductor device during the manufacturing process;

FIG. 6 to FIG. 11 are cross-sectional views illustrating the subsequent steps as taken along line II-II' in FIG. 2 to FIG. 5.

DETAILED DESCRIPTION

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention. The following detailed description is, therefore, not to be taken in a limiting sense, and the scope of the present invention is defined by the appended claims, along with the full scope of equivalents to which such claims are entitled.

According to one embodiment of the invention, an exemplary method of fabricating a Fin Field-Effect-Transistor (FinFET) device is provided. One major feature of this invention is that the poly cut process is performed after the source/drain epitaxial growth and the interlayer dielectric (ILD) planarization process, thereby avoiding epitaxial extrusion defects that occurs in the prior art processes.

Please refer to FIG. 1 to FIG. 11, which illustrate an exemplary process of fabricating a semiconductor device according to one embodiment of the invention. FIG. 1 to FIG. 5 are schematic plan views showing a portion of the semiconductor device during the fabrication process. FIG. 1A, FIG. 2A, FIG. 3A, FIG. 4A and FIG. 5A are cross-sectional views taken along line I-I' in FIG. 1 to FIG. 5, respectively. FIG. 2B, FIG. 3B, FIG. 4B and FIG. 5B are cross-sectional views taken along line II-II' in FIG. 2 to FIG. 5, respectively. FIG. 6 to FIG. 11 are cross-sectional views illustrating the subsequent steps as taken along line II-II' in FIG. 2 to FIG. 5.

Figure 1:
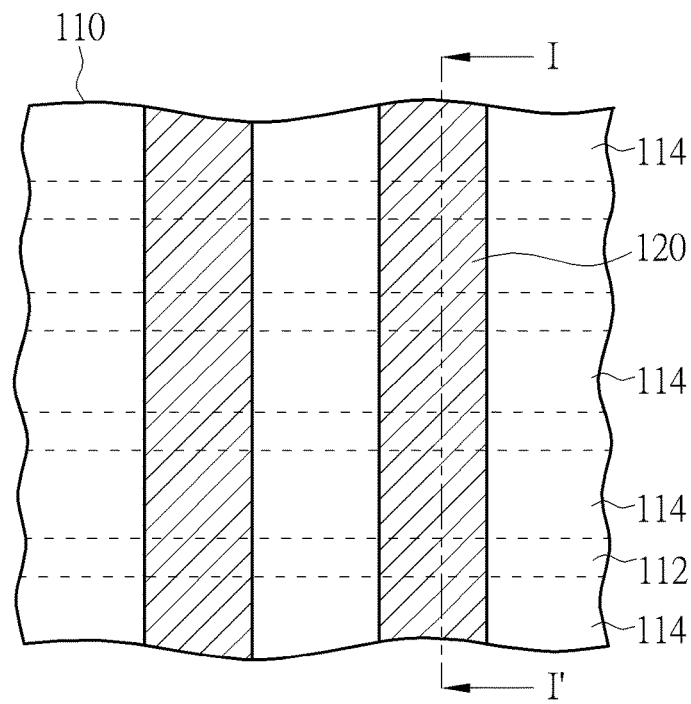
Figure 1A:
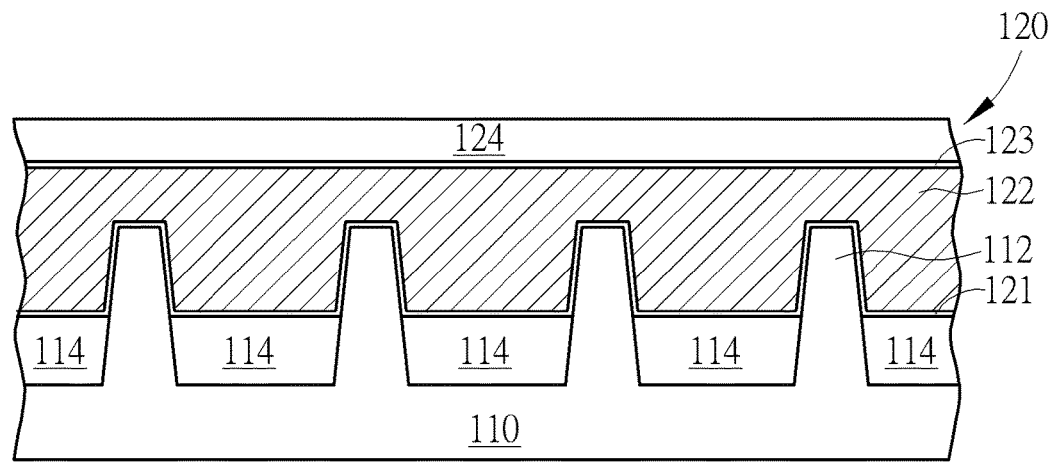
FIG. 1A, FIG. 2A, FIG. 3A, FIG. 4A and FIG. 5A are cross-sectional views taken along line I-I' in FIG. 1 to FIG. 5, respectively.

First, as shown in FIG. 1, a substrate 110 is provided. For example, the substrate 110 may be a silicon substrate or any other suitable semiconductor substrates. A plurality of fin structures 112 is then formed in the substrate 110. For example, to form the fin structures 112, a hard mask (not shown) is formed on the substrate 110. The hard mask is patterned to define the regions corresponding to the fin structures to be formed. Subsequently, an etching process is performed to form the fin structures 112. An isolation structure 114 is then formed between these fin structures 112.

According to one embodiment, after forming the fin structures 112, the hard mask (not shown) may be removed, and a tri-gate MOSFET may be formed in the following process. The tri-gate MOSFET has three contacting interfaces (two sidewalls and one top surface) between the fin structure 112 and the dielectric layer formed in a later stage. In comparison with the conventional planar field effect transistor at the same channel length, the tri-gate MOSFET using the three contacting interface as the carrier flow channel, and advantageously, can provide wider channel width, making it possible to have doubled drain driving current under the same driving voltage.

In another embodiment of the invention, the hard mask (not shown) is kept to construct another kind of multi-gate MOSFET in the following process, which also has fin structure, known as Fin Field-Effect-Transistor (FinFET). The hard mask (not shown) covers the top surfaces of the fin structures. Therefore, the FinFET only has two contacting interfaces between the fin structure 112 and the dielectric layer formed in a later stage.

As described hereinabove, other kinds of semiconductor substrates may be employed in this invention. In another embodiment of the invention, for example, a silicon-on-insulator (SOI) substrate (not shown) may be provided. By performing photolithography and etching processes, the single crystalline silicon layer of the SOI substrate (not shown) is etched until the underlying oxide layer is exposed, thereby forming fin structures on the SOI substrate.

For the sake of clarity, only four fin structures are shown in the figures. However, it is understood that single fin structure or multiple (more than four) fin structures are also applicable to other embodiments.

After the fin structures 112 and the isolation structures 114 are formed, at least two parallel and continuous dummy gate lines 120 are formed. The parallel and continuous dummy gate lines 120 traverse the fin structures 112 and isolation structures 114. The parallel and continuous dummy gate lines 120 stride across the fin structures 112. For the sake of simplicity, only two dummy gate lines 120 are shown in the figures. But the invention is not limited thereto. To form the dummy gate lines 120, for example, a gate material layer (not shown) is deposited on the fin structures 112 and the substrate 110 in a blanket manner. After that, a hard mask (not shown) is formed on the gate material layer and then patterned by photolithography process to define the regions where the dummy gate lines 120 are to be formed in the gate material layer. Then, through the following etching process, the pattern of the hard mask is transferred to the gate material layer, thereby forming the dummy gate lines 120. The hard mask is then removed.

According to the illustrated embodiment, the aforesaid gate material layer may comprise amorphous silicon, but not limited thereto. In other embodiments, for example, the gate material layer may comprise polysilicon or the like. Each of the dummy gate lines 120 may comprise a stack structure composed of a gate dielectric layer 121, a sacrificial gate 122, a lining layer 123, and a cap layer 124, but not limited thereto. According to the illustrated embodiment, the sacrificial gate 122 may comprise polysilicon, the lining layer 123 may comprise silicon nitride, and the cap layer 124 may comprise silicon oxide, but not limited thereto.

Figure 2:
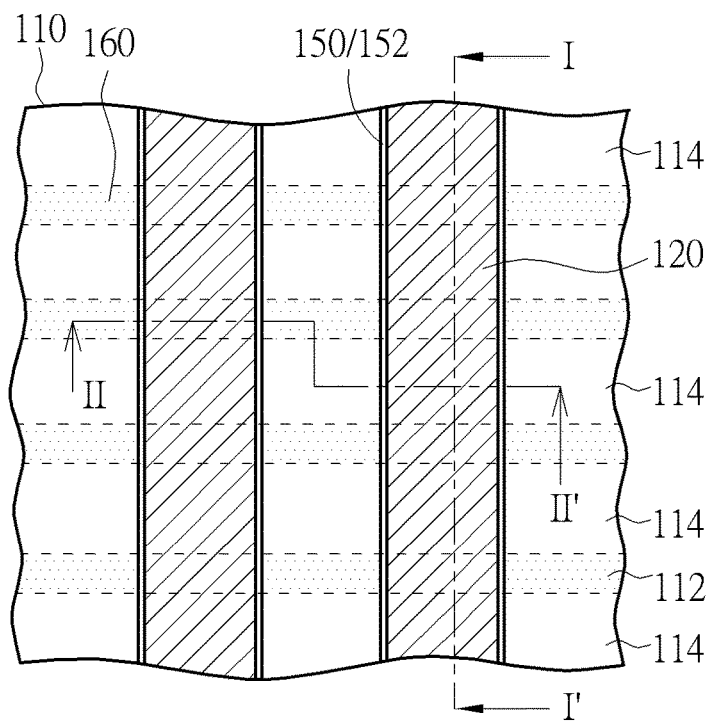
Figure 2A:
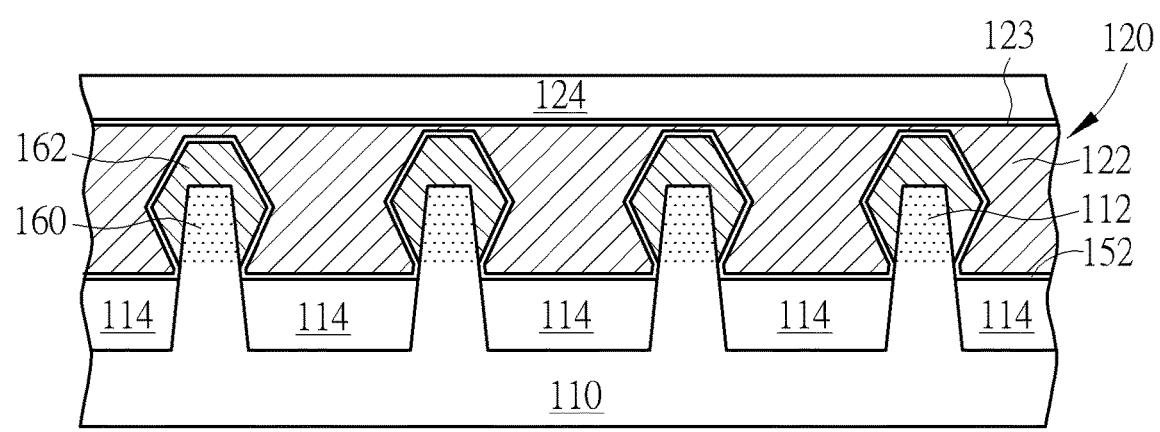
Figure 2B:
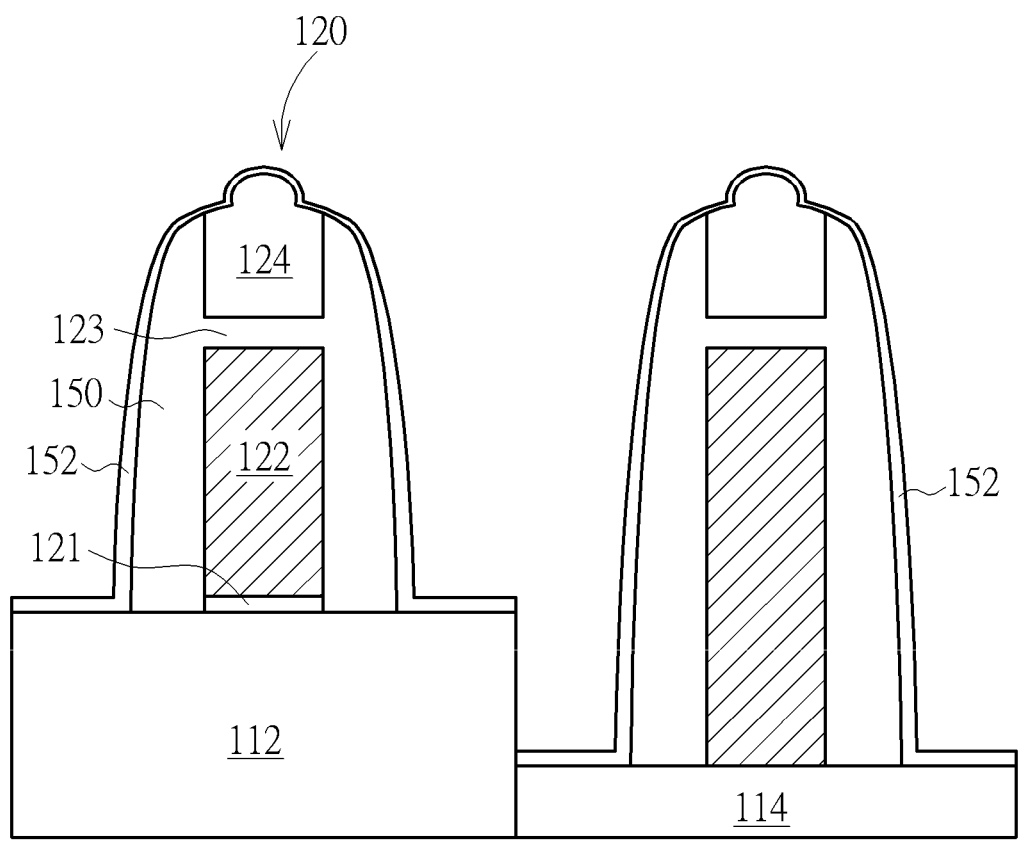
FIG. 2B, FIG. 3B, FIG. 4B and FIG. 5B are cross-sectional views taken along line II-II' in FIG. 2 to FIG. 5, respectively.

Please refer to FIG. 2, FIG. 2A and FIG. 2B. A lightly doped drain (LDD) process may be carried out to form an LDD region (not shown) in the fin structures 112 on either side of each of the dummy gate lines 120. An epitaxial process is then performed to form an epitaxial layer 162 on the fin structures 112 on either side of each of the dummy gate lines 120. The epitaxial layer 162 may comprise, for example, SiGe for PMOS transistors and SiP for NMOS transistors, but not limited thereto.

Subsequently, a spacer 150 is formed on a sidewall of each of the dummy gate lines 120. For example, the spacer 150 may comprise a SiN spacer, but not limited thereto. Subsequently, a source/drain (S/D) doping process is carried out to forma source/drain (S/D) region 160 in the fin structures 112 on either side of each of the dummy gate lines 120. A contact etching stop layer (CESL) 152 is then conformally deposited on the dummy gate lines 120 and the S/D regions 160. The contact etching stop layer (CESL) may comprise a SiN layer, but not limited thereto.

Figure 3:
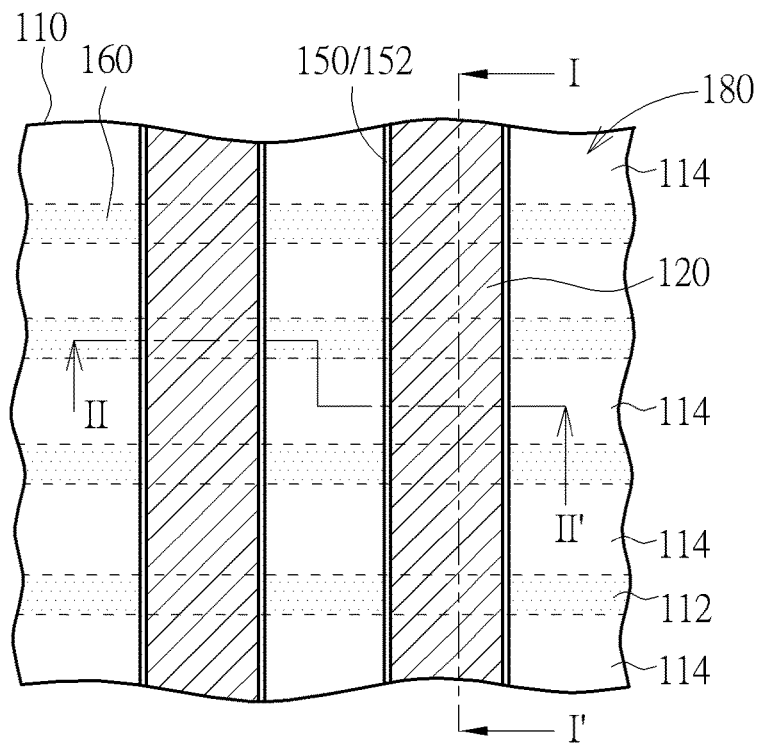
Figure 3A:
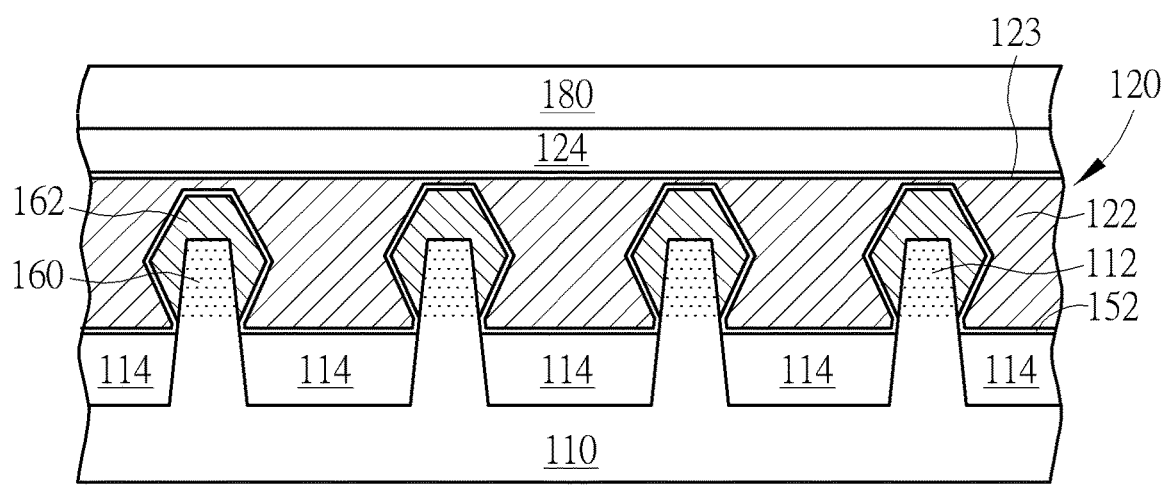
Figure 3B:
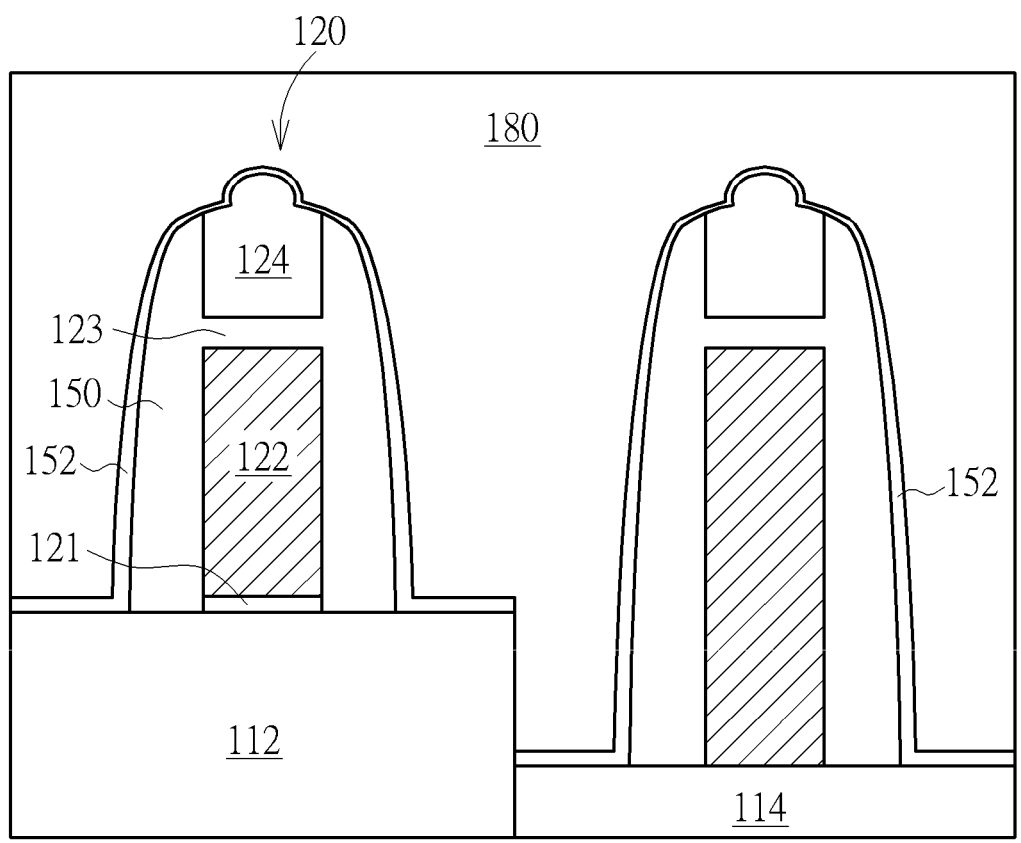

As shown in FIG. 3, FIG. 3A and FIG. 3B, a chemical vapor deposition (CVD) process, e.g. flowable CVD (FCVD), is performed to blanket deposit an interlayer dielectric layer (ILD) 180, such as a silicon oxide layer. The ILD 180 fills up the spaces between the dummy gate lines 120. The ILD 180 also covers the dummy gate lines 120.

Figure 4:
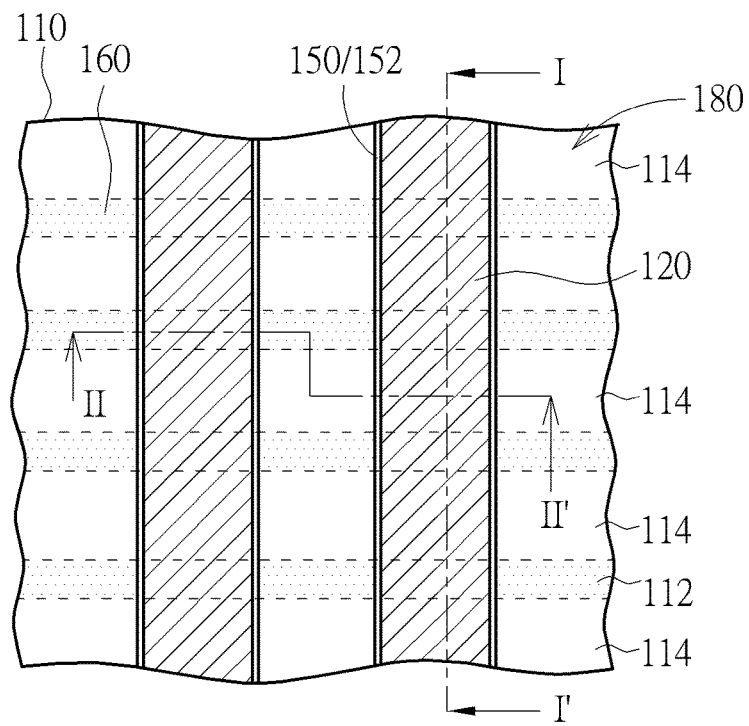
Figure 4A:
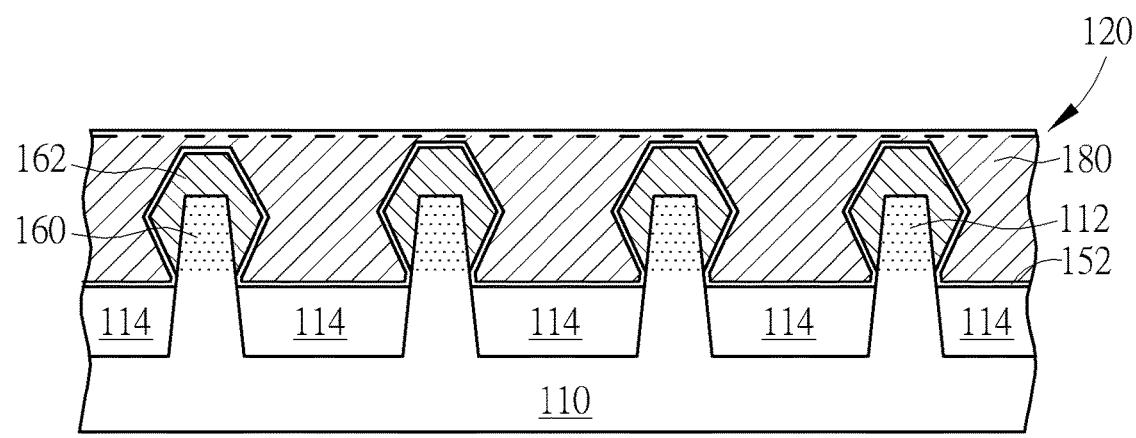
Figure 4B:
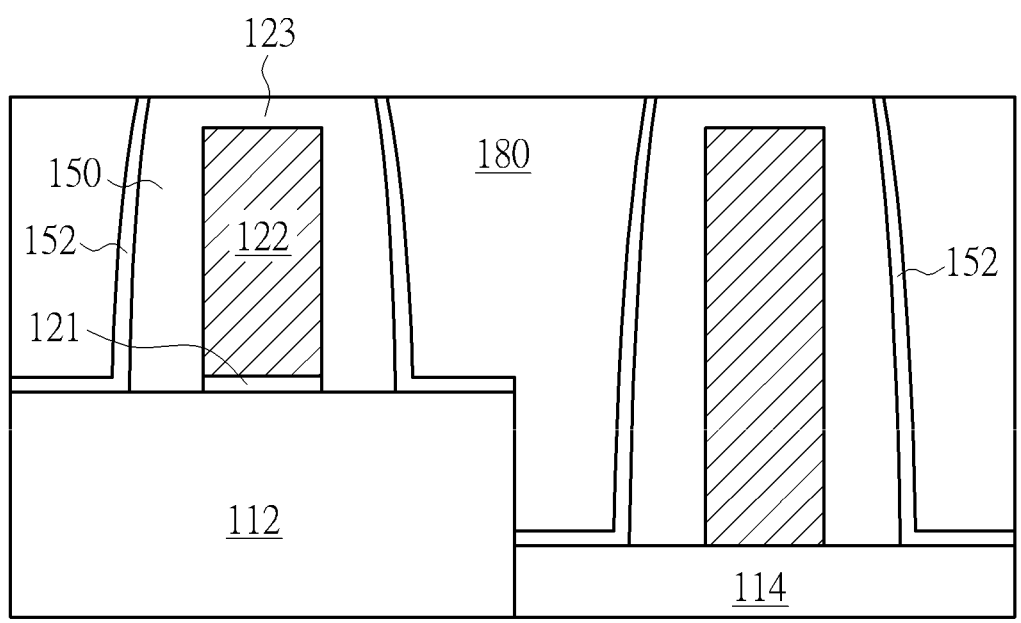

As shown in FIG. 4, FIG. 4A and FIG. 4B, a chemical mechanical planarization (CMP) process is performed to remove a portion of the ILD 180 and the entire cap layer 124. After the CMP process is complete, the top surface of the ILD 180 is substantially flush with the lining layer 123 of each of the dummy gate lines 120.

Figure 5:
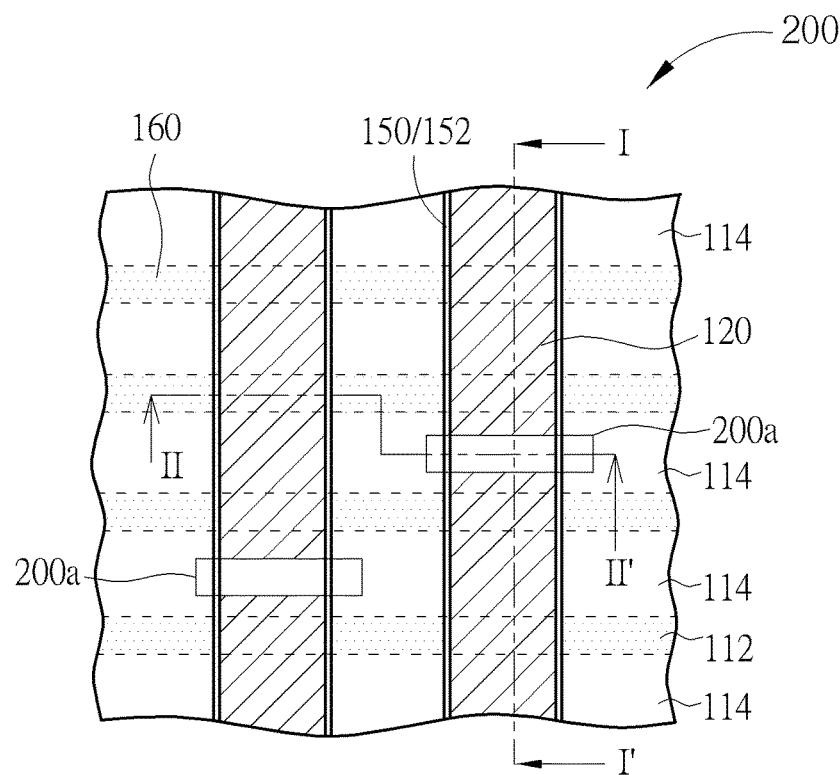
Figure 5A:
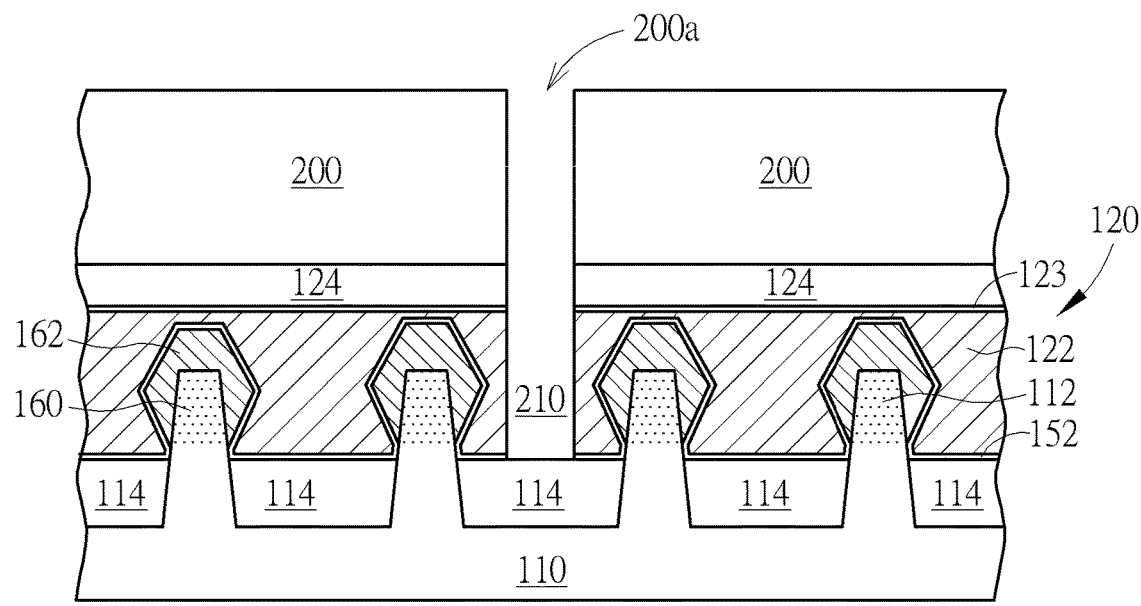
Figure 5B:
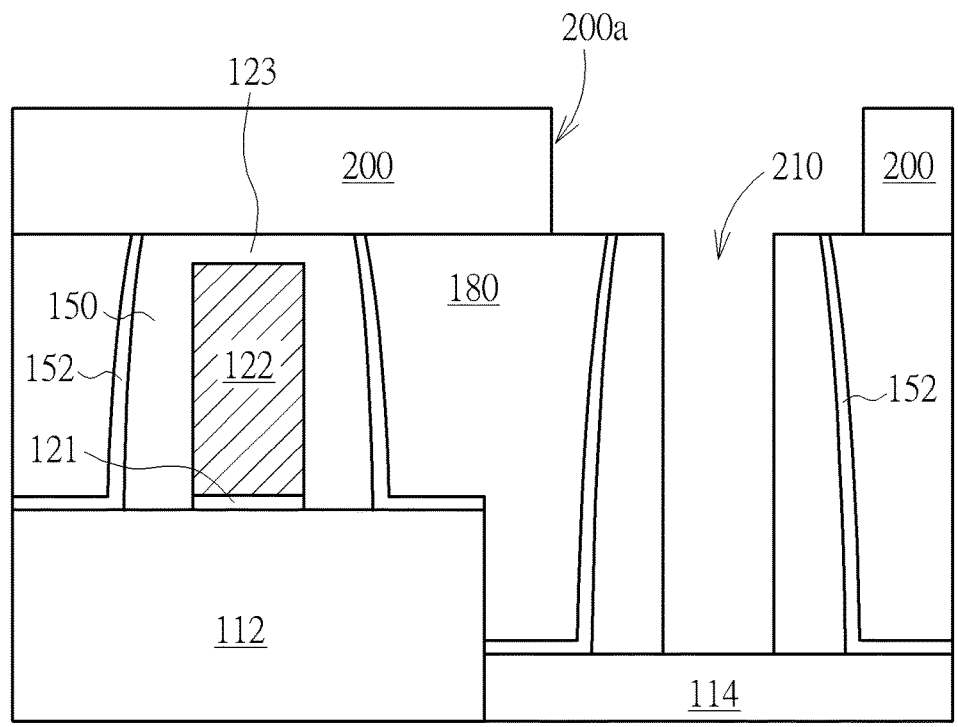

As shown in FIG. 5, FIG. 5A and FIG. 5B, a photoresist pattern 200 is then formed on the ILD 180 and the dummy gate lines 120. The photoresist pattern 200 includes openings 200a which are the regions where each of the dummy gate lines 120 to be discontinued or cut. The allocation of the openings 200a in the figures is for illustration purposes only. Using the photoresist pattern 200 as an etching hard mask, an etching process, e.g. dry etching process, is performed to selectively remove the exposed lining layer 123 and the sacrificial gate 122 through the openings 200a, thereby forming openings 210. The openings 210 are also called "cut slots".

The steps shown in FIG. 5, FIG. 5A and FIG. 5B are also called segmenting of dummy gate line or "poly cut". After the poly cut, each of the originally continuous dummy gate lines 120 is cut into a plurality of discontinuous segments of dummy gate pattern. According to the illustrated embodiment, the aforesaid etching process selectively removes the exposed lining layer 123 and the sacrificial gate 122 through the opening 200a, but leaves the spacer 150 intact in the opening 200a.

Figure 6:
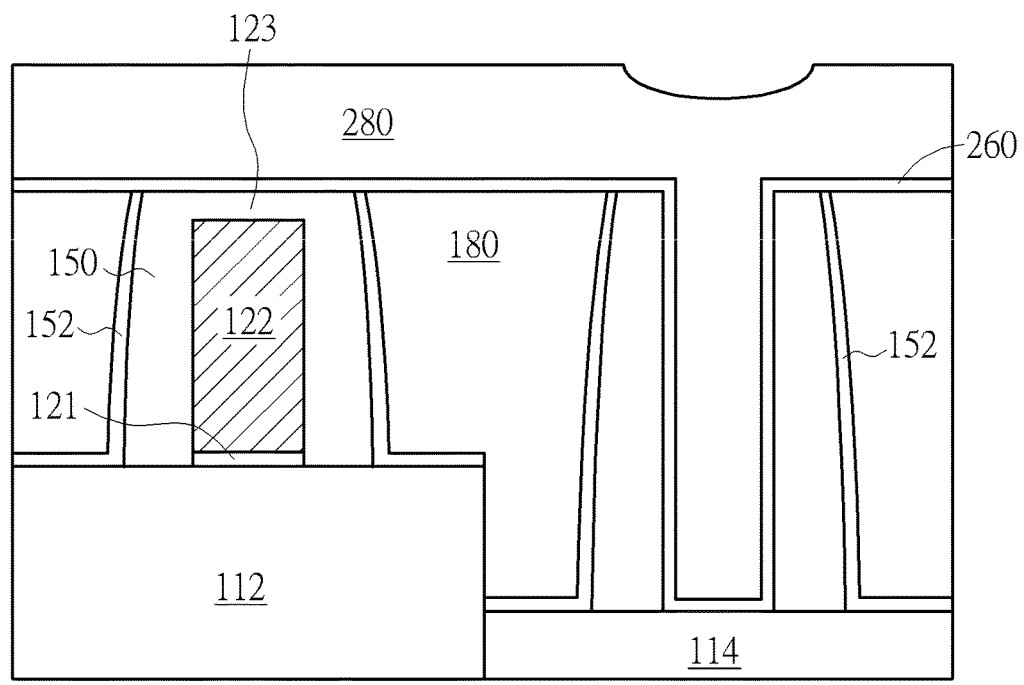

FIG. 6 to FIG. 11 illustrate the subsequent steps of making the semiconductor device according to the embodiment, where FIG. 6 to FIG. 11 are the cross-sectional views as taken along line II-II' in FIG. 2 to FIG. 5. As shown in FIG. 6, the remaining photoresist pattern 200 is removed. Optionally, a liner 260 may be conformally deposited on the interior surface of the opening 210. The liner 260 may comprise SiN, SiON, or $SiO_2$. According to the illustrated embodiment, the liner 260 does not fill up the opening 210. The liner 260 may be formed by atomic layer deposition (ALD) process, but not limited thereto. In another embodiment, for example, the liner 260 may fill up the opening 210. Subsequently, a dielectric layer 280 is deposited on the liner 260. According to the illustrated embodiment, the dielectric layer 280 fills up the opening 210. The dielectric layer 280 may comprise silicon oxide and may be formed by FCVD process.

Figure 7:
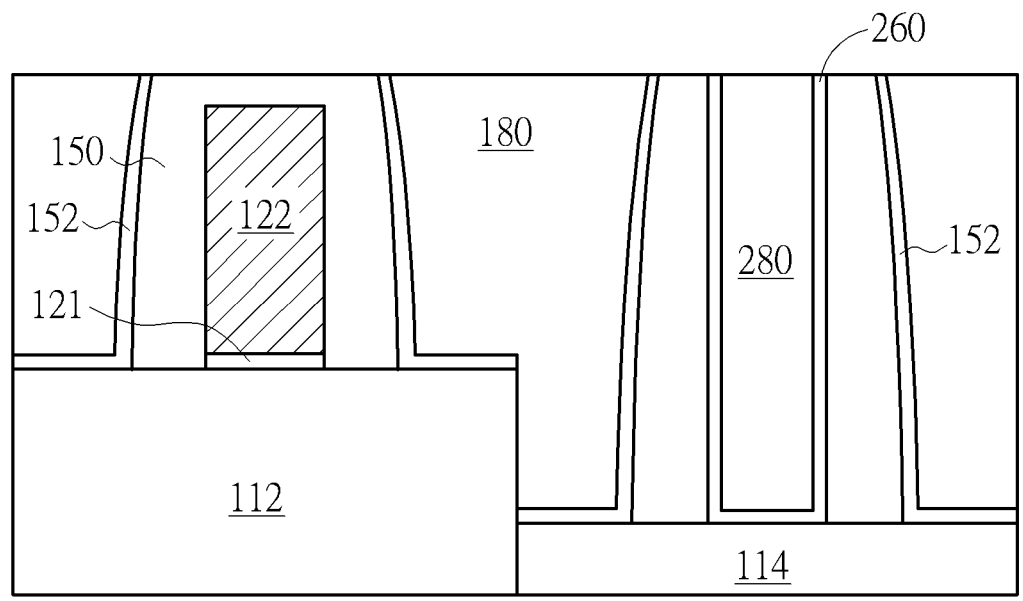

As shown in FIG. 7, a CMP process is then performed to polish away a portion of the dielectric layer 280. The liner 260 outside the opening 210 is removed, thereby exposing the top surface of the ILD 180. At this point, the top surface of the ILD 180 is substantially flush with the liner layer 123 of the dummy gate line 120.

Figure 8:
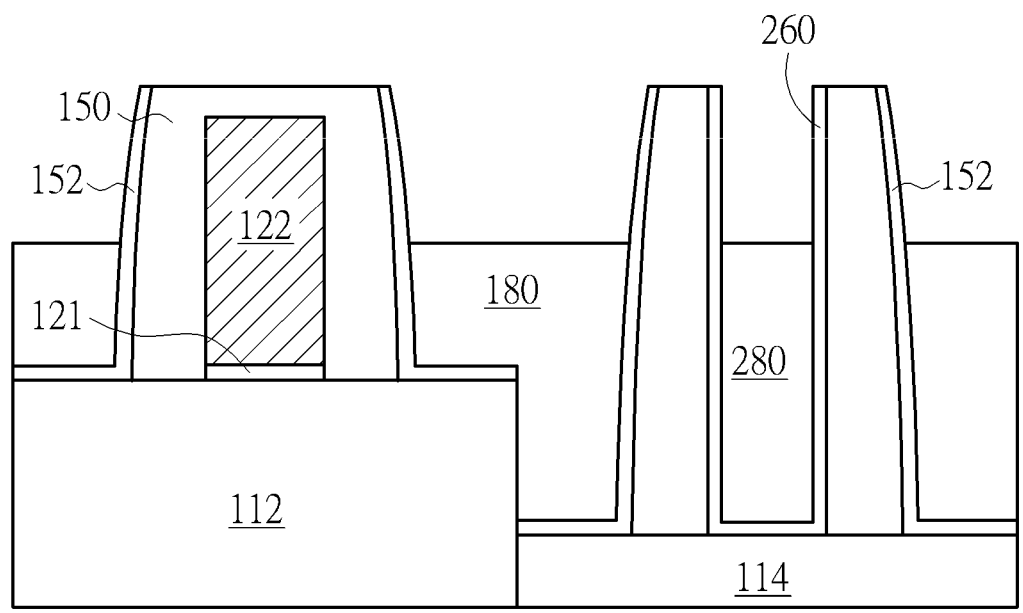

As shown in FIG. 8, an optional recess etching process, e.g. SiConi™ etch process, may be carried out to remove a predetermined thickness of the ILD 180 and the dielectric layer 280, thereby revealing the upper portion of the dummy gate line 120 and the upper portion of the spacer 150/CESL 152/liner 260.

Figure 9:
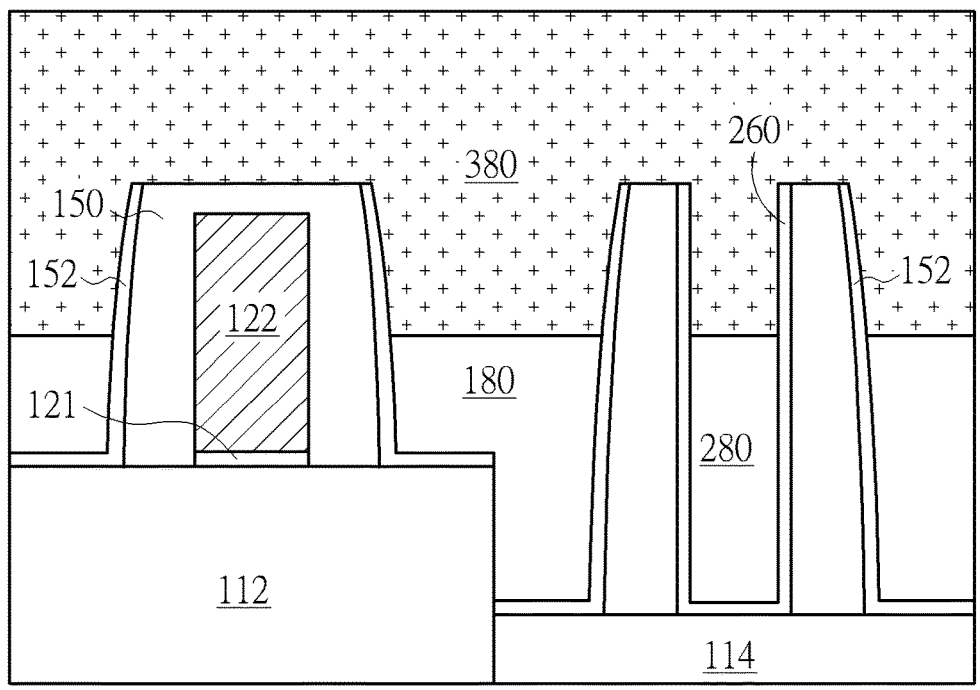

As shown in FIG. 9, an optional high-density plasma chemical vapor deposition (HDP CVD) process is performed to deposit an HDP oxide layer 380 in a blanket manner. The HDP oxide layer 380 covers the upper portion of the dummy gate line 120 protruding from the ILD 180. The HDP oxide layer 380 also fills into the opening 210.

Figure 10:
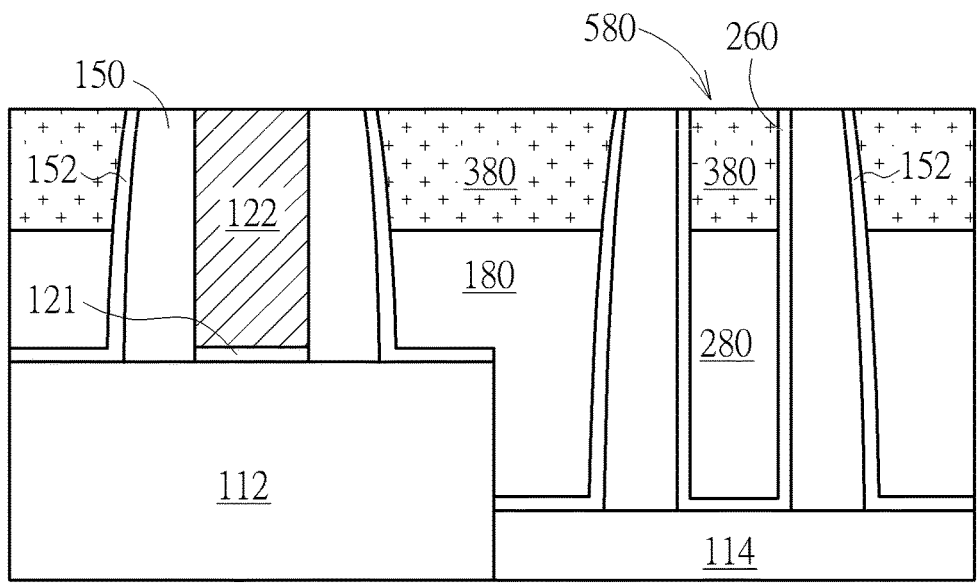

As shown in FIG. 10, another CMP process is carried out to polish away a portion of the HDP oxide layer 380 and the liner layer 123 on the dummy gate line 120, thereby exposing the top surface of the sacrificial gate 122. At this point, the opening 210 is collectively filled up with the dielectric layer 280 and the HDP oxide layer 380, and surrounded by the liner 260, thereby forming an isolation plug structure 580. The liner 260 prevents the filling material, i.e. the dielectric layer 280 and the HDP oxide layer 380, from direct contact with the spacer 150.

Figure 11:
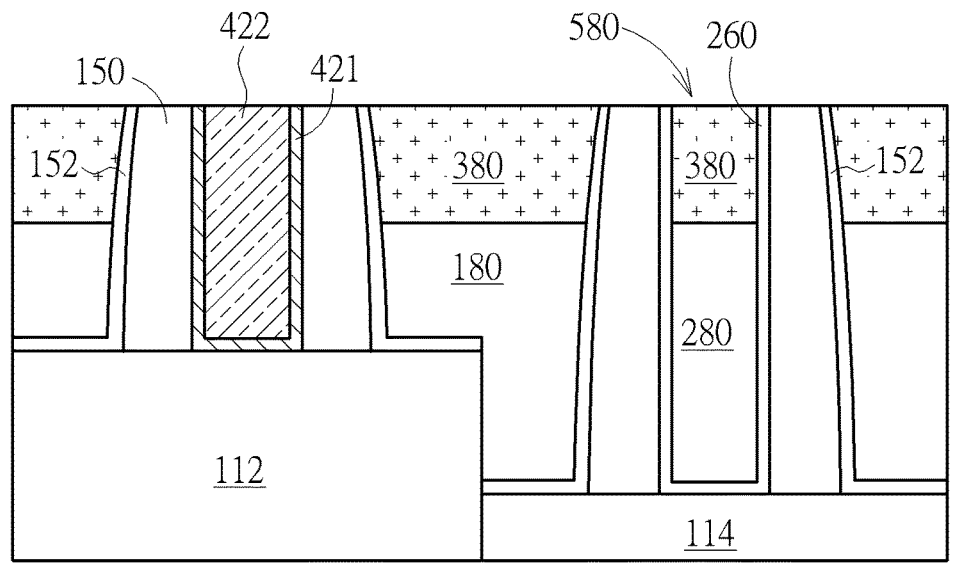

As shown in FIG. 11, the sacrificial gate 122 and the gate dielectric 121 are removed, thereby forming a plurality of discontinuous gate trenches. These discontinuous gate trenches are separated from one another by the isolation plug structure 580. Subsequently, a high-k dielectric layer 421 and a replacement metal gate 422 are formed in these gate trenches.

The high-k dielectric layer 421 may be composed of a material selected from the group including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), or barium strontium titanate ($Ba_xSr_{1-x}TiO_3$, BST), etc.

The replacement metal gate 422 may comprise, from bottom to top, a bottom barrier layer, a metal layer with desired work function, a top barrier layer and a main conducting layer. The bottom barrier layer may comprise a single or composite layer comprising tantalum nitride (TaN) or titanium nitride (TiN), etc. The metal layer may comprise a single or a composite layer with desired work function which meets the transistor's requirement. The metal layer may be composed of a material selected from the group including titanium nitride (TiN), titanium carbide (TiC), tantalum nitride (TaN), tantalum carbide (TaC), tungsten carbide (WC), titanium aluminide (TiAl), aluminum titanium nitride (TiAlN), etc. Similarly, the top barrier layer may comprise a single or composite layer comprising tantalum nitride (TaN) or titanium nitride (TiN), etc. The main conducting layer may comprise aluminum, tungsten, titanium aluminum alloy (TiAl), cobalt tungsten phosphide (CoWP), or those material with low resistance.

Figure 12:
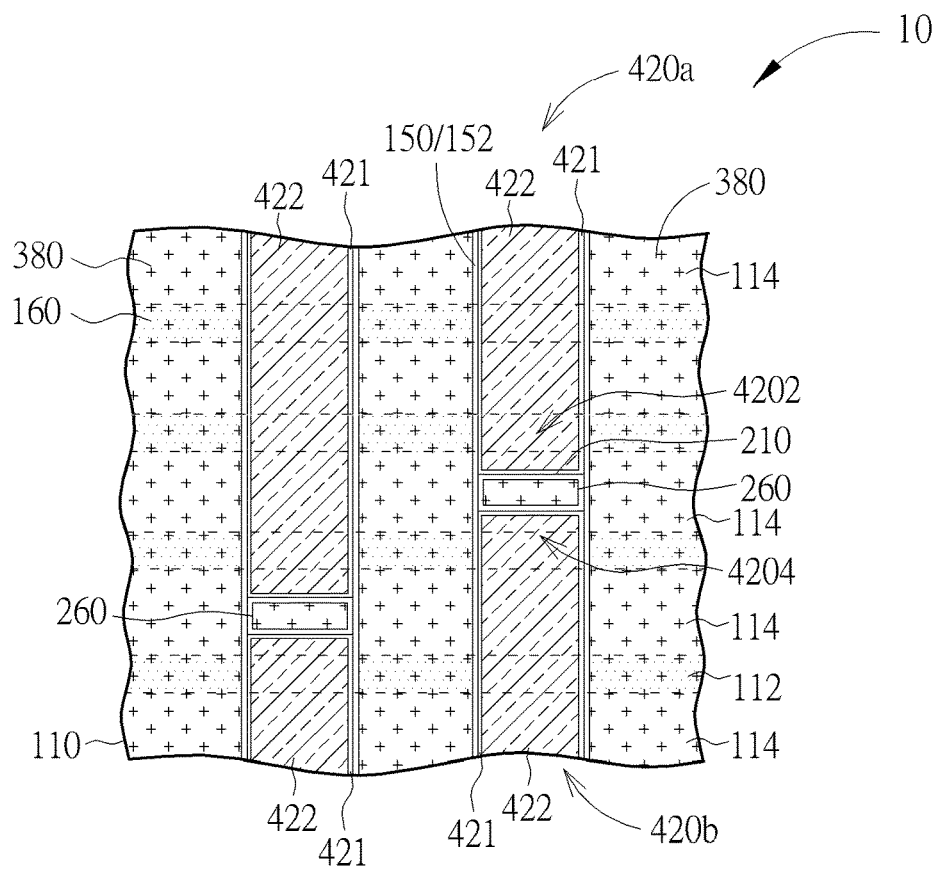
FIG. 12 is a schematic plan view showing the semiconductor device according to the invention.

FIG. 12 shows the plan view of the semiconductor device 10 according to one embodiment of the present invention. The semiconductor device 10 comprises a substrate 110. A first gate structure 420a is disposed on the substrate 110. The first gate structure 420a comprises a first distal end 4202. A second gate structure 420b is disposed on the substrate 110, which is spaced apart from the first gate structure 420a and aligned with the first gate structure 420a. The second gate structure 420b comprises a second distal end 4204 facing the first distal end 4202. A cut slot 210 is disposed between the first distal end 4202 and the second distal end 4204. A liner layer 260 is disposed on interior surface of the cut slot 210. A HDP silicon oxide layer 380 is disposed on the liner layer 260. The HDP silicon oxide layer 380 fills into the cut slot 210.

This invention provides an improved semiconductor structure and manufacturing process, which segmenting the dummy gate lines after the source/drain epitaxial growth and interlayer dielectric (ILD) planarization process, therefore the epitaxial extrusion problem occurring at the distal end of the poly silicon gate in the prior art can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for making a semiconductor device, comprising:
    providing a substrate having a fin structure thereon;
    forming a continuous dummy gate line on the substrate, wherein the dummy gate line strides across the fin structure;
    forming a source/drain structure on the fin structure on either side of the dummy gate line;
    forming an interlayer dielectric (ILD) on the dummy gate line and around the dummy gate line;
    polishing the ILD to thereby reveal a top surface of the dummy gate line; and
    after polishing the ILD, segmenting the dummy gate line into separated dummy gates.

2. The method for making a semiconductor device according to claim 1, wherein the step of segmenting the dummy gate line into separated dummy gates further comprises:
    forming a photoresist pattern on the ILD and on the top surface of the dummy gate line, wherein the photoresist pattern comprises an opening exposing a portion of the dummy gate line;
    removing the exposed portion of the dummy gate line through the opening to thereby forming a cut slot; and
    removing the photoresist pattern.

3. The method for making a semiconductor device according to claim 2 further comprising:
    filling the cut slot with at least one dielectric layer.

4. The method for making a semiconductor device according to claim 3, wherein the dielectric layer comprises a silicon oxide layer.

5. The method for making a semiconductor device according to claim 3, wherein the step of filling the cut slot with at least one dielectric layer further comprises:
   forming a liner layer within the cut slot.

6. The method for making a semiconductor device according to claim 5, wherein the liner layer comprises a silicon nitride layer.

7. The method for making a semiconductor device according to claim 3, wherein before filling the cut slot with at least one dielectric layer, the method further comprises:
   filling the cut slot with a liner layer.

8. The method for making a semiconductor device according to claim 7, wherein the liner layer comprises a silicon nitride layer.

9. The method for making a semiconductor device according to claim 1 further comprising:
   removing the separated dummy gates to thereby form separated gate trenches; and
   forming replacement gates into the separated gate trenches respectively.

10. The method for making a semiconductor device according to claim 1, wherein the replacement gates comprise metal.

* * * * *